United States Patent [19]

Kirby et al.

[11] Patent Number: 5,049,810
[45] Date of Patent: Sep. 17, 1991

[54] WATT-HOUR METER COVER WITH BATTERY HATCH RESET SWITCH AND OPTICAL COMMUNICATION PORT

[75] Inventors: Lane C. Kirby, West Point; Lester C. Moore, West Lafayette; Christopher J. Gatz, West Lafayette; Ronald C. Tate, Battle Ground, all of Ind.

[73] Assignee: Landis & Gyr Metering, Inc., Lafayette, Ind.

[21] Appl. No.: 410,980

[22] Filed: Sep. 22, 1989

[51] Int. Cl.⁵ .................. G01R 1/04; G01R 19/16; G06C 15/42
[52] U.S. Cl. .................. 324/156; 235/144 MA; 324/103 R; 324/110; 324/157
[58] Field of Search .......... 235/144 MA; 324/103 R, 324/110, 157, 116, 142, 156; 361/364

[56] References Cited

U.S. PATENT DOCUMENTS

| | | | |
|---|---|---|---|
| 3,908,166 | 9/1975 | Shackford | 324/103 R |
| 4,074,192 | 2/1978 | Hart | 324/103 R |
| 4,075,561 | 2/1978 | Stevens | 324/156 |
| 4,188,575 | 2/1980 | Palmer et al. | 324/103 R |
| 4,297,635 | 10/1981 | Stevens | 324/156 |
| 4,298,839 | 11/1981 | Johnston | 324/157 |
| 4,491,793 | 1/1985 | Germer et al. | 324/157 |
| 4,584,527 | 4/1986 | Amigo | 324/157 |
| 4,602,211 | 7/1986 | Losapio et al. | 324/103 R |
| 4,638,314 | 1/1987 | Keller | 340/870.02 |
| 4,688,146 | 8/1987 | Newmark et al. | 361/364 |
| 4,712,017 | 12/1987 | Kamasaki | 250/551 |
| 4,713,609 | 12/1987 | Losapio et al. | 324/156 |
| 4,783,623 | 11/1988 | Edwards et al. | 324/156 |
| 4,791,362 | 12/1988 | Philpot | 324/157 |

FOREIGN PATENT DOCUMENTS

| | | | |
|---|---|---|---|
| 2630608 | 1/1978 | Fed. Rep. of Germany | 324/103 R |
| 2015177 | 9/1979 | United Kingdom | 324/103 R |

OTHER PUBLICATIONS

DAC TMC-101 Sales Brochure, Domestic Automation Company, 1986.

*Primary Examiner*—Ernest F. Karlsen

[57] ABSTRACT

A watt-hour meter cover is provided which has an optical coupler including a conduit, lens, and means for engaging an external programmer/reader. The conduit has improved signal transmission properties. The cover may be designed to disable test mode hardware when replaced after meter servicing. A battery access hatch and module with a reset and scroll actuator is installed through the cover.

11 Claims, 6 Drawing Sheets ns. US Pat. No. 4,712,017 to Kamasaki shows a photo coupler device which comprises a light emitting element and a
WATT-HOUR METER COVER WITH BATTERY HATCH RESET SWITCH AND OPTICAL COMMUNICATION PORT

BACKGROUND OF THE INVENTION

This invention relates generally to watt-hour meter covers and more particularly to watt-hour meter covers featuring enhanced access to and reliability in the operator interactive controls and displays of the meter.

The importance of interactive communication in energy consumption metering is recognized. For example, U.S. Pat. No. 4,638,314 to Keller discloses a remotely-read energy meter to which an electronics package has been added, the package includes a thin annular printed circuit board mounted for support on an annular adapter ring and disposed in surrounding relation to the annular watt-hour meter. Electrical components mounted on the printed circuit board provide an electronic read-out circuit for a pulse initiator, and further provide the transponder electronics for effecting bidirectional communication between the watt-hour meter and a remote location.

U.S. Pat. No. 4,783,623 to Edwards et al. discloses a device for converting standard electric meters to programmable interactive meters. The device includes a circuit for measuring energy use and is designed for installation below the rotating disc of a standard meter.

In response to the need for interactive communication, modern electric energy meters are equipped with operator interactive controls and readouts. A reset switch which is mechanically activated through hardware mounted to and passing through the face of the meter cover is typically present to enable resetting of the meter after energy consumption has been recorded. An LED indicator for calibration purposes pulses in relation to the power being measured. An infrared (IR) emitter/detector operates to bidirectionally exchange data and control commands with utility personnel and/or electronic data handling devices through an optical communication port mounted on the face of the meter. Communication between the fixed IR emitter/detector and the portable reader/programmer occurs through the transparent cover of the meter.

Problems are encountered in the design of the present systems. One problem arises since reset switch hardware normally has metal parts. Consequently, it is an entry point for electrostatic discharge (ESD) which can damage circuit components of the printed circuit board of the register. The IR emitter/detector has adequate power and sensitivity to operate only within very restricted ranges, alignment, and ambient light conditions. One solution to this problem has been to increase the distance between the register face and the meter cover face to reduce the incidence of ESD damage through the metallic hardware. This has made optical communication less reliable due to increased distance and greater exposure to interfering ambient light, mandating the use of specially designed meter covers to provide the necessary accuracy of cover to register spacing and precise alignment of the optical communication port with the emitter/detector to assure reliable operation over the full range of assembly tolerances and other manufacturing and service variables.

Improvement of signal transmissions in photo coupling devices has been a subject of some interest. U.S. Pat. No. 4,712,017 to Kamasaki shows a photo coupler device which comprises a light emitting element and a light receiving element made of a four layer structure of PNPN conductivity wherein a portion of the light receiving element through which the light enters does not contribute to its operation is covered with a light reflecting membrane.

Various configurations facilitating interactive communication in energy consumption meters have been proposed. U.S. Pat. No. 4,298,839 to Johnston is an example of an electric energy meter having a programmable time base measuring system. A radiation sensitive external data interface receives and transmits data through a transparent communications window of the meter cover. The cover is provided with accurately spaced conical recesses which mate with projections on the programmer/reader. A radiation shielding baffle is mounted in the meter housing enclosed by the cover.

U.S. Pat. No. 4,584,527 to Amigo discloses a watt-hour metering system including a meter enclosed in a transparent cover and having an electronic register with a multichannel infrared responsive I/O port in a portable electronic programmer/reader having a complimentary infrared data I/O port. Inside the cover, the meter includes a pivoting shutter having a pair of magnets affixed thereto and held by gravity in a position to shield at least one channel of the I/O from radiation entering the cover. An activating magnet is affixed to the programmer/reader such that when the programmer/reader is placed against the meter cover, magnetic flux is coupled to the shutter magnets to cause the shutter to pivot and permit the transmission of infrared radiation. Alternatively, a shutter is pivotally secured to the cover and manually operable from outside the cover to selectively permit and prevent transmission of radiation.

U.S. Pat. No. 4,491,793 to Germer et al discloses a meter cover mounted receptacle and attachable magnetic coupler incorporating optical communication devices for communicating with electric circuitry housed within the meter cover. An umbilical cable enables an infrared emitter and detector to be assembled to the inside face of the meter cover directly inside the optical port hardware, thus controlling distance, alignment and ambient light.

Significant advantages in tooling cost and product lead time may be realized if it is possible to update meters using their existing glass or plastic covers. Certain designs presently in manufacture seek to improve upon the lack of manufacturing latitude imposed by the factors discussed above. One design, available from Landis & Gyr Metering, Inc. as PDR-A ™, uses an electrically insulated reset switch to prevent entry of electrostatic discharge and thereby significantly reduces the cover-to-register space and thus the optical communication distance. This design, however, still requires a specially designed plastic cover to maintain the minimum spacing requirement and to provide the fine detail necessary to integrate the optical port into the end of the cover. Moreover, the insulating materials used in the reset switch do not have sufficient rigidity to facilitate an adjustment feature required to accommodate existing covers.

The design shown in Germer et al using an umbilical cable allows the cover depth to be varied by the designer as required to accommodate reset hardware or utilize existing cover designs without concern for optical communication reliability. The umbilical cable from the register to the optical port in the meter cover, however provides a solution that is awkward to handle and assemble, making access to the meter face difficult, and is relatively expensive to manufacture due to the number of additional components.

Consequently, there remains a need for an optical port design which efficiently transmits optical signals and yet offers simple assembly, ease of service, ruggedness and accommodates other meter design considerations. Most advantageously, such an optical port would be readily retrofitted to existing covers to preserve the investment in such.

Meters are commonly equipped with test mode switches which enable the meter operator to determine whether the meter is functioning properly or is in need of service. Commonly, these switches are accessed by removing the cover of the meter. It often occurs that, after testing the meter, the operator neglects to disengage the test mode switch. Because the meter is left in the test mode it does not record energy consumption. There is a need for test hardware design that addresses this problem.

With respect to other features of modern meters, it has been recognized that access to the meter battery and scroll and reset switches without the necessity of removing the meter cover is advantageous. Further, external access to the battery and switch actuators should be limited to prevent tampering. In this regard, various designs for switch actuators have been proposed. For example, U.S. Pat. No. 3,908,166 to Shackford discloses a watt-hour meter cover mounted rotary reset actuator incorporating a combination key operated, tamper resistant security lock and a rotary motion limiting device preventing application of excessive torque.

U.S. Pat. No. 4,074,192 to Hart discloses an external manual mechanism for resetting a cumulative demand register. The mechanism can be simply locked and unlocked for periodic use and may be applied to cumulative demand registers on watt-hour meters. A plunger with an arm pushes the reset crank. The mechanism is spring-biased in the disengaged mode.

U.S. Pat. No. 4,188,575 to Palmer et al discloses a meter cover mechanism incorporating a combination key operated tamper resistant security lock and externally controllable meter reset actuator and a meter access hatch. The reset switch is contacted by an actuator arm if the key is turned in the proper direction with the hatch closed. Access to the programmer probe is provided when the hatch is opened. Insertion of a battery replacement tool into the open hatch is suggested.

U.S. Pat. No. 4,602,211 to Losapio et al discloses an electronic demand register for an electric meter including a plurality of push button controls for controlling material displayed or a mode of operation of the demand register. A lockable switch actuator includes an actuating paddle within a cover or housing of the meter which, when unlocked, can be rotated into alignment with a selected one of the push button controls and then pushed inward to actuate the selected push button control.

Efforts have also been directed to providing restricted access hatches. U.S. Pat. No. 4,688,146 to Newmark et al is exemplary. A three piece molded plastic enclosure for service entry into apparatuses such as meters, fuses, circuit breakers, and switches is disclosed. The enclosure provides protection against adverse environmental conditions, while providing visual access to the components contained therein. The enclosure is tamper proof by virtue of a hinge arrangement formed between a stationary cover and a movable door. Once the door is assembled to the cover, the door cannot be easily removed without a separate tool.

Easy servicing of meter batteries is recognized as desirable. U.S. Pat. No. 4,791,362 to Philpot discloses a module meter assembly including a replaceable battery modules. An adaptor used with the meter assembly provides for retrofitting an improved modular structure on existing meters to permit upgrading of the functions performed by the existing meters. The modular device is designed for installation beneath the cover of the meter.

Further, some meters provide access to the meter battery without removing the meter cover. U.S. Pat. No. 4,075,561 to Stevens discloses an electrical apparatus enclosed within a housing containing a replaceable battery. Means for programming and for testing by means of connectable electrical contacts with an independent instrument are provided. The electrical apparatus is provided with a composite unit comprising a battery support and an electrical terminal connector which is arranged to cooperate with a single access port in the apparatus housing whereby routine servicing of battery replacements, programming and/or testing can be performed through a single port.

U.S. Pat. No. 4,297,635 to Stevens discloses an apparatus for retaining a replaceable battery comprised of a unitary structure having a chamber therein for receiving a battery and a resilient retaining means cooperating in the chamber with the battery provides a structure for easily replacing the battery. The apparatus is particularly adaptable to a programmable electrical watt-hour meter where a battery and programming connector in the watt-hour meter may be accessed through an access port in a housing of the watt-hour meter to replace the battery and service the watt-hour meter.

U.S. Pat. No. 4,713,679 to Losapio et al discloses a case including a hatch which permits removal and replacement of a battery without removing the case from the meter. In one embodiment the battery is installed in a battery clip on the face plate on the meter which is accessible through the hatch. An extra length of wires from the battery permits the battery and its miniconnectors to be withdrawn through the hatch for replacement thereof. In a second embodiment of the invention, the battery is captured in a durable hatch and is withdrawn from the meter by the action of opening hatch. In this embodiment, the hatch may be hinged or not hinged.

As demonstrated by the foregoing, the need for efficient access to the scrolling, resetting functions and routine maintenance aspects of watt-hour meters is understood. Until the present, this need has not been adequately addressed in a combined battery access hatch and locking reset and test switch assembly structure.

SUMMARY OF THE INVENTION

Accordingly, the present invention addresses these needs in a cover for an energy consumption meter having a radiation signal transmitter for external communications with an external reader. The cover is mounted on the meter and has a communication coupler assembly creating a signal communication pathway between the transmitter and the external reader. The cover includes a cover member, a conduit for conducting the transmitted radiation signal. The conduit is mounted in the cover for communicative alignment of a solid portion thereof along its length with the transmitter when the cover is mounted on the meter and includes enhanced internal reflection of the transmitted signal. Further included is a portion for engaging the reader with the coupler.

A further aspect of the present invention involves a cover for an energy consumption meter having a radiation signal transmitter for external communications with an external reader with the cover mounted on the meter and having a communication coupler assembly creating a signal communication pathway between the transmitter and the external reader including a conduit for conducting the transmitted radiation signal. The conduit is mounted on the cover for communicative alignment with the transmitter when the cover is mounted on the meter and is formed substantially from a solid material which is opaque to the transmitted signal and has at least one signal transparent channel therethrough. A window is provided at one end of the conduit along with provision for engaging the external reader with the coupler assembly about the conduit.

A further aspect of the present invention is in combination, an energy consumption meter having a test mode and a removable and replaceable cover, including a meter body having a side and a test switch pivotally mounted in the side. The switch is operable when pivoted outward from the side to initiate a test mode of the meter and inoperable when pivoted at least flush with the side. The cover includes a cover member having a continuous side wall. The side wall has a rim defining an internal diameter sufficiently small that upon replacement of the cover over the meter body, the rim engages the switch if the switch is in its test mode position to pivot the switch to its inoperable position thereby disabling the test mode.

In a still further aspect of the present invention, a cover for an energy consumption meter having a meter body with a battery mounted therein and a cover mountable over the body and having a modular battery access hatch assembly includes a cover member, a hatch opening defined in the cover member for access to the battery therethrough, a hatch cover mountable over the opening to close said hatch opening and a resetting switch carried by said hatch cover for actuating the reset mode hardware externally of the meter cover. The reset switch is normally biasing away from said reset hardware. Also included is a latch for latching the hatch cover onto the meter cover.

It is an object of the present invention to provide an improved watt-hour meter cover.

It is another object of the present invention to provide a watt-hour meter cover with an improved optic coupler assembly therethrough.

It is a further object of the present invention to provide a watt-hour meter cover which, upon replacement, disables test hardware.

It is a still further object of the present invention to provide a watt-hour meter cover with improved battery access and reset/scroll hardware.

Other objects and advantages may be readily discerned to those with skill in the art to which the invention pertains after reviewing the following written description and accompanying figures.

DESCRIPTION OF THE PREFERRED EMBODIMENTS

Figure 1:
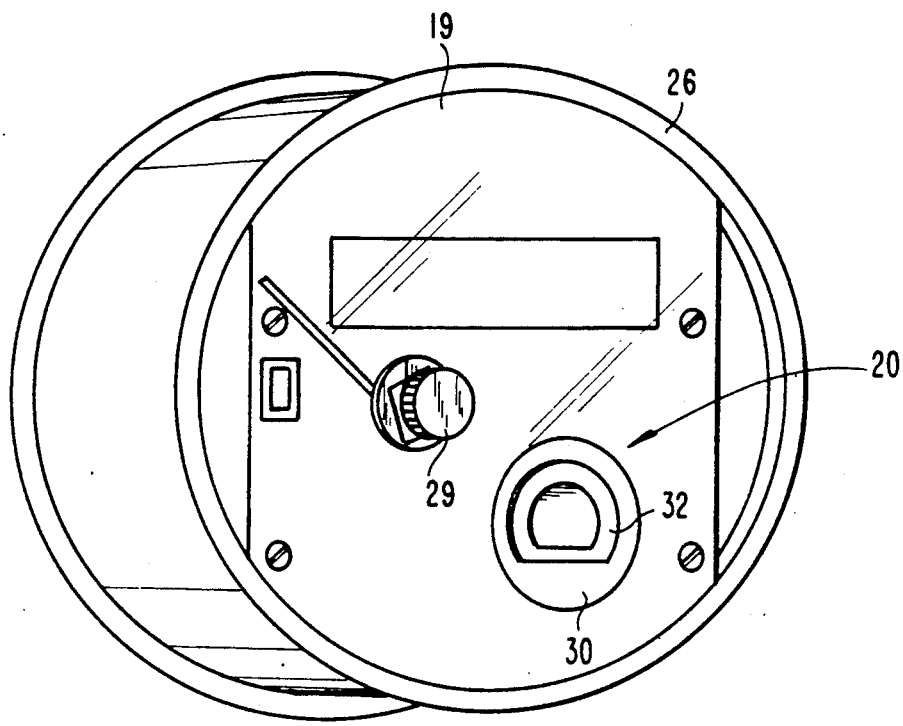
FIG. 1 is a front perspective view of an optical coupler of the present invention installed through a standard meter cover.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated devices and methods, and such further applications of the principles of the invention as illustrated therein being contemplated as would normally occur to one skilled in the art to which the invention relates.

FIG. 1 illustrates a watt-hour meter 19 and optical coupler assembly 20 according to a first embodiment of the present invention installed through cover 26 thereof. Optical coupler assembly 20 creates a signal communication pathway between infrared emitter/detector 21 (FIG. 2) and an external reader (not shown). The meter shown is a standard resettable watt-hour meter. For example, the meter may be one similar to PDR-A available through Landis & Gyr Metering, Inc. of Lafayette, Indiana. External reset hardware 29 is present through cover 26 for resetting the cumulative energy consumption counter after the meter has been read. For engaging an external reader/programmer, port ring 30 is configured to mate with the probe of the reader/programmer. In FIG. 1 port ring 30 is shown to have an outer annulus 33 enclosing horseshoe-shaped projecting shoulder 32. This design corresponds to a similar but matingly opposite female portion of the reader/programmer probe. Typically, the probe has a magnetically inductive portion so that port ring 30 is preferably made of paramagnetic material, preferably steel. The preferred embodiment is powdered metal. The horseshoe shape of shoulder 32 and the corresponding portion of the probe, requires that the probe and coupler assembly 20 can only be mated in one relative position. In the relative position, the flat part of the horseshoe receives the flat part of the probe. This relative position is preferably the position of maximum signal alignment. Consequently, the necessary alignment of the probe and coupler is easily achieved upon engagement of the probe and the coupler. It will be understood that other configurations also would provide mating alignment of the probe and the coupler and no limitation is inferred by the foregoing description.

Figure 2:
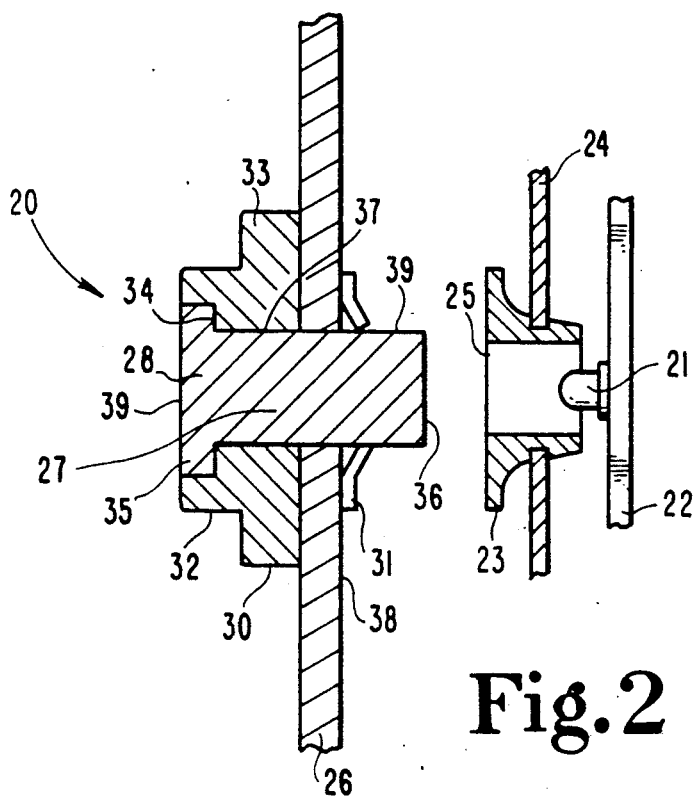
FIG. 2 is a partial cross-sectional view through the cover and face of a watt-hour meter showing a first alternate optical coupler assembly made according to a first embodiment of the present invention.

FIG. 2 is a partial cross-sectional view through the face and cover 26 of a watt-hour meter showing a first alternate optical coupler assembly made according to the first embodiment of the present invention. The arrangement of the individual parts of coupler assembly 20 provides an environmental seal as well as an engagement for the external reader and a transparent window allowing the emitted signal to pass from the emitter on the meter face through the meter cover and into the external reader. Emitter/detector 21 is present on printed circuit board 22. Tunnel 23 is mounted in register face plate 24 in optical alignment with emitter/detector 21. A portion 25 of tunnel 23 is transparent to the infrared signal emitted by emitter/detector 21. As shown in FIG. 2, transparent portion 25 is a bore through tunnel 23. Mounted on meter cover 26 is optical coupler 20 aligned with bore 25 to create a signal communication pathway between emitter/detector 21 and the external reader. Optical coupler 20 includes solid conduit 27, window 28, port ring 30 and lock washer 31. Port ring 30 is designed as described above in connection with FIG. 1. Conduit 27 and window 28 are inserted therethrough. The internal diameter of port ring 30 widens creating surface 34. Against this surface abuts lip 35 of window 28. As a consequence of the abutting arrangement of lip 35 and surface 34, window 27 retains port ring 30 against meter cover 26. Lock washer 31 secures conduit 27 within cover 26 by exerting a securing force against the circumference of conduit 27 and inside surface 38 of cover 26. To enhance the fastening and environmental sealing functions of coupler 20, a sealant may be applied between the mating surfaces of the various components of the coupler, for example at mating surface 37. Any sealant commonly used for this purpose may be used. The choice of sealant will be readily apparent to those familiar with the art to which this invention pertains.

A signal from emitter/detector 21 passes through tunnel 23, entering conduit 27 where it passes through window 28 and into the probe of the external reader/programmer matingly engaged with coupler 20. A signal from the reader/programmer probe to emitter/detector 21 travels the same path but in the reverse direction. Conduit 27 is solid to transmit the emitted signal with high optical efficiency due to increased total internal reflection. In the preferred embodiment the external surface is polished to enhance internal reflection. Such a solid is commonly referred to a "light pipe". The light pipe configuration retains window 28 flush with the coupling surface 39 of the coupler while conduit 27 extends toward emitter/detector 21 as far as required, allowing for assembly tolerances. The innermost surface 36 of conduit 27 is, therefore, quite close to the emitting and detecting elements of the meter. More signal energy is thus intercepted. The energy so intercepted is effectively carried within the conduit while ambient light is nearly effectively excluded. The described configuration of conduit 27 minimizes the total signal distance which is extended through air. In general, passage through air reduces the reliability of the signal. To enhance the exclusion of ambient light, the outer surface 39 of conduit 27 can be provided with an opaque coating such as a black coating. Further, to enhance internal reflection a coating having an index of refraction greater than the light pipe can be used. Of course, signal receiving portions such as surface 36 and window 28 should not be so coated. In addition, tunnel 23 is preferably made of an opaque material and most preferably black. The preferable material for constructing conduit 27 and window 28 is plastic and most preferably acrylic, although other materials having the requisite signal transparency and transmission characteristics may be used. The conduit and window are preferably molded and of unitary construction, although other commonly used methods of manufacture are suitable.

Figure 3:
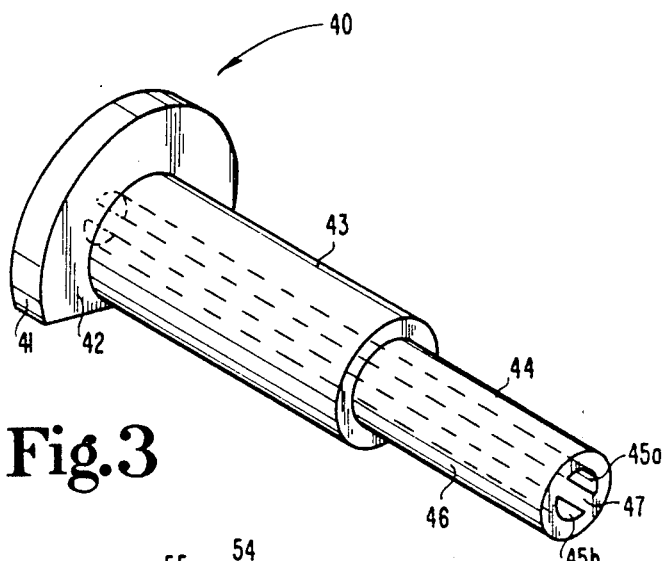
FIG. 3 is a perspective view of a second alternate of the first embodiment according to the present invention.

FIG. 3 is a perspective view showing of a second alternative of the first embodiment according to the present invention. Conduit and window assembly 40 is shown with window 41, cover abutting surface 42 and lock surface 43 for receiving a lock washer. Stepped down portion 44 is smaller in outer diameter than lock surface 43. Two hollows 45a and 45b are formed parallel to the longitudinal axis of assembly 40. Solid signal transmission pathway 47, is disposed between the hollows. Assembly 40 is installed in a meter cover in the manner described above. The outside surface of a meter cover abuts surface 42. A lock washer such as that shown in FIG. 2 grasps surface 43. The length of surface 43 is sufficient to accommodate covers of different thicknesses while still supplying a grasping surface for the lock washer. The external surface of assembly 40, exclusive of surfaces in the signal pathway, are optionally provided with opaque coating 46 to minimize signal interference caused by ambient light. Most preferably, coating 46 is black. Stepped down portion 44 prevents coating 46 from being scraped by placement of the lock washer.

Hollows 45a and 45b are provided to reduce the quantity of plastic required to make each assembly 40 while improving the optic characteristics as well. As described above, the conduit and window are preferably made of molded plastic. In molding, molten plastic is molded to the desired shape and allowed to cool. Cooling of the plastic typically is not uniform throughout, plastic near the surface cooling faster than plastic in the center. Generally, uneven cooling rates of molten material used to form assembly 40 cause imperfections in the density, etc of the assembly. These imperfections distort the transmitted signal. Increasing uniformity of cooling results in improved optical properties. Hollows 45a and 46b increase the surface area of the assembly so cooling takes place more evenly. Consequently, improved cooling rates, cost efficiency and desirable optical characteristics from light pipe type signal transmission are provided by this alternate of the present invention.

The coupler assemblies described above may be easily retrofitted to existing meter covers. To retrofit a coupler assembly to an existing cover, a hole of appropriate diameter is drilled through the glass or plastic meter cover. The window/conduit/port ring assembly is inserted through the resulting hole. A lock washer is placed around the portion of the conduit on the inside of the cover. If a sealant is used, the sealant is preferably spread on the appropriate surfaces before insertion.

The length of the light pipe is readily adaptable to the requirements of a particular meter and its cover. Since the length of the signal path varies depending on the meter face stackup, the relative length of the conduit can be varied accordingly to achieve the optimum result. In meters having covers relatively far above the meter itself, for example, to reduce ESD damage, the light pipe may be longer to account for the additional space. In meters having covers more closely spaced to the register plate, the light pipe may be shortened.

The primarily solid light pipe of the present invention has produced about a ten fold increase in the millivolt output of the detector, making communication with the detector/emitter far more reliable. Using this type of coupler allows the meter designer to use virtually any existing or proposed meter cover design and/or reset hardware design otherwise suitable for the application. Only minor design consideration needs to be given to the optical coupler itself. The present invention also provides ease and economy of manufacture and assembly due to the minimum number of parts required and the simple way the coupler is installed on the meter cover. Ease in field service handling is provided by the lack of an umbilical cable connection, ease of field cleaning operations and the ruggedness of the assembly. Flexibility results from the inherent adaptability of the coupler to varying cover height. Economy and reduced manufacturing lead time results from the ability to use existing cover designs in many cases, while allowing relaxation of manufacturing constraints on alignment and spacing variation. The total distance that a signal must travel through air is minimized, increasing reliability. Ambient light interference is minimized by the inherent total internal reflectance and by the optional opaque coatings. Moreover, the design creates a system which is more tolerant to misalignment of the emitter/detector and the reader/programmer.

Figure 4:
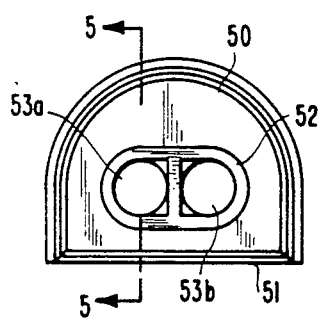
FIG. 4 is an elevational view of a conduit made according to a third alternate of the first embodiment of the present invention.

A third alternative optical coupler assembly according to the first embodiment of the present invention is depicted in FIGS. 4 through 7. FIG. 4 is an elevational view of conduit 50. Conduit 50 is primarily in the shape of a closed horseshoe having a flat bottom surface 51. Conduit 50 has forward projection 52 which is substantially 8-shaped. Each loop of the eight forms a channel, 53a and 53b respectively, for through which the signal passes.

Figure 5:
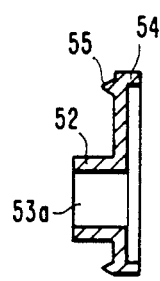
FIG. 5 is a cross-sectional view of the conduit of FIG. 4 taken along line 5—5 and looking in the direction of the arrows.

FIG. 5 is a cross-sectional view of conduit 50 taken through line 5—5 of FIG. 4 and looking in the direction of the arrows. Conduit 50 has rearwardly projecting lip 54 and may be provided with ridge 55 to facilitate ultrasonic welding according to processes which are familiar with the art to which the invention pertains.

Figure 6:
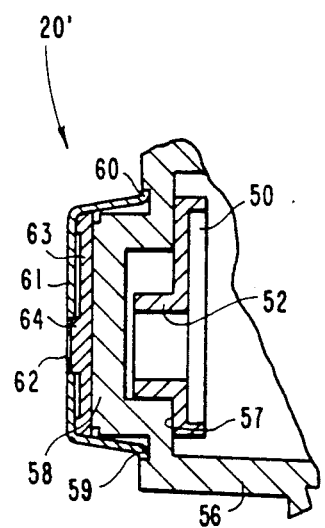
FIG. 6 is a partial cross-sectional view of a conduit assembly including the conduit of FIG. 4.

FIG. 6 is a partial cross-sectional view of coupler assembly 20' made according to the third alternate of the present invention. Cover 56 has been specially formed to accommodate conduit 50 and the other elements of coupler 20'. Conduit 50 is shown ultrasonically welded to cover 56 at mating surface 57. Ultrasonic welding causes ridge 55 to melt, adhering to surface 57 and thus, joining conduit 50 with cover 56. Projections 52a and 52b extend forwardly into window 58. Window 58 is formed integrally with cover 56 as an externally projecting solid horseshoe. Annular groove 59 is formed on the outer surface of the cover about window 58 to accommodate and fixedly receive flange 60 of port ring 61. Preferably, flange 60 is ultrasonically welded to cover 56. Port ring 61 is formed with a window 62 therethrough for accommodating signal transmission between the infrared emitter/detector and the external reader/programmer. In addition, UV filter 63 may be provided between window 58 and port ring 61. In the case where a UV filter is provided, such filter has a portion 64 formed in a shape corresponding to window 62 and inserted therethrough.

Figure 7:
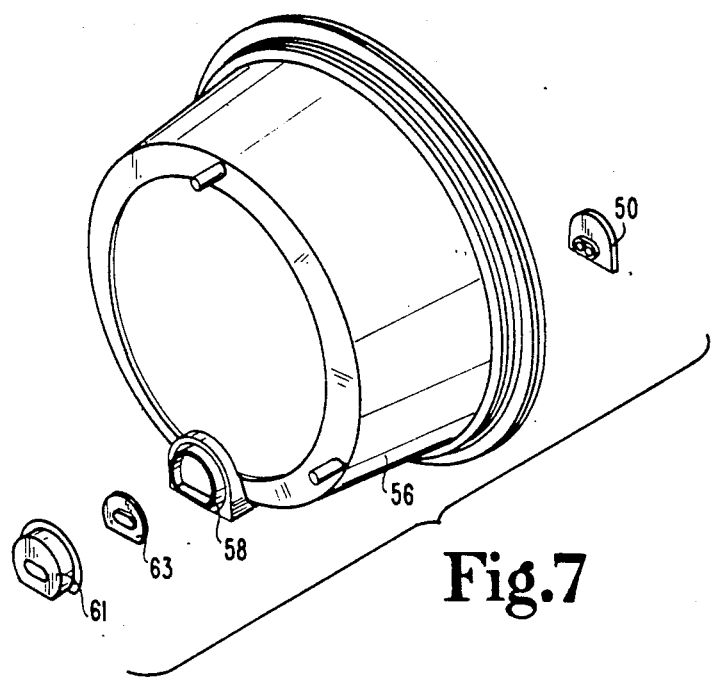
FIG. 7 is an exploded perspective view of a meter cover including the assembly of FIG. 6.

FIG. 7 is an exploded view of a meter cover assembly including an optical port according to the present invention, further illustrating the relationship of the component parts of optical coupler 20'.

As described in connection with the first and second alternates of the present invention, an external reader/programmer is matingly engaged by port ring 61. For this purpose, port ring 61 is preferably made of paramagnetic material, and most preferably powdered metal. Upon mating alignment of the external reader/programmer with optical coupler 20' creating a communication pathway with emitter/detector, signals are received by and sent therefrom. Conduit 50 is preferably made of plastic and preferably black plastic. Most preferably, conduit 50 is made of black polycarbonate. Cover 56 is also preferably made of plastic and most preferably clear polycarbonate. Filter 63 is preferably made of blue polycarbonate. In addition, port ring 61 may be chrome-plated.

It will be understood that the invention is not limited to infrared signal emitters. Other signal types may also be communicated through the coupler of the present invention. Further, the emitter/detector may act as only a detector or only an emitter. In other words, the present invention improves transmission between a meter and an external reader regardless of the direction of the signal path, or, in general, the type of signal transmitted.

Figure 8:
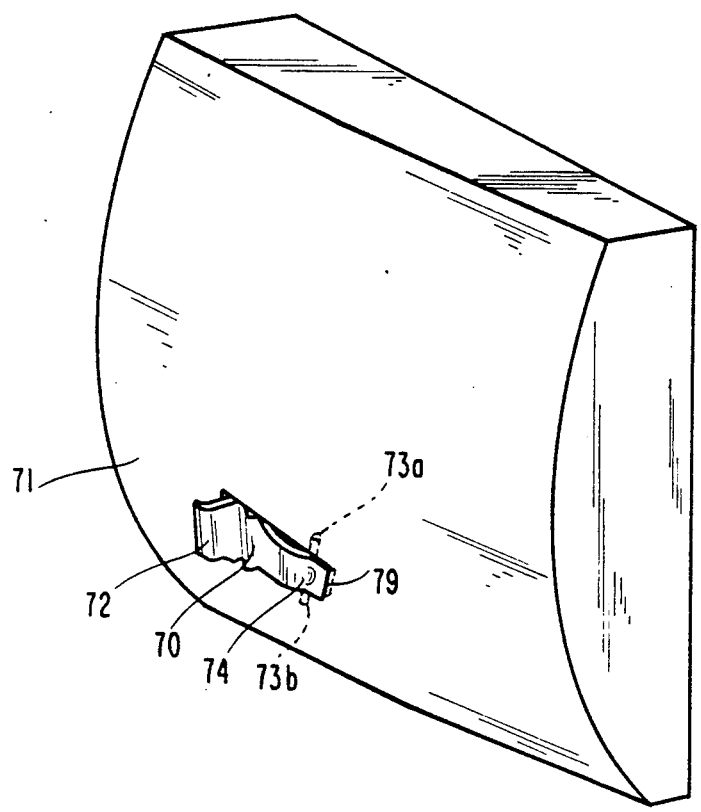
FIG. 8 is a partial elevational view of a test and reset switch made according to another aspect of the present invention.
Figure 9:
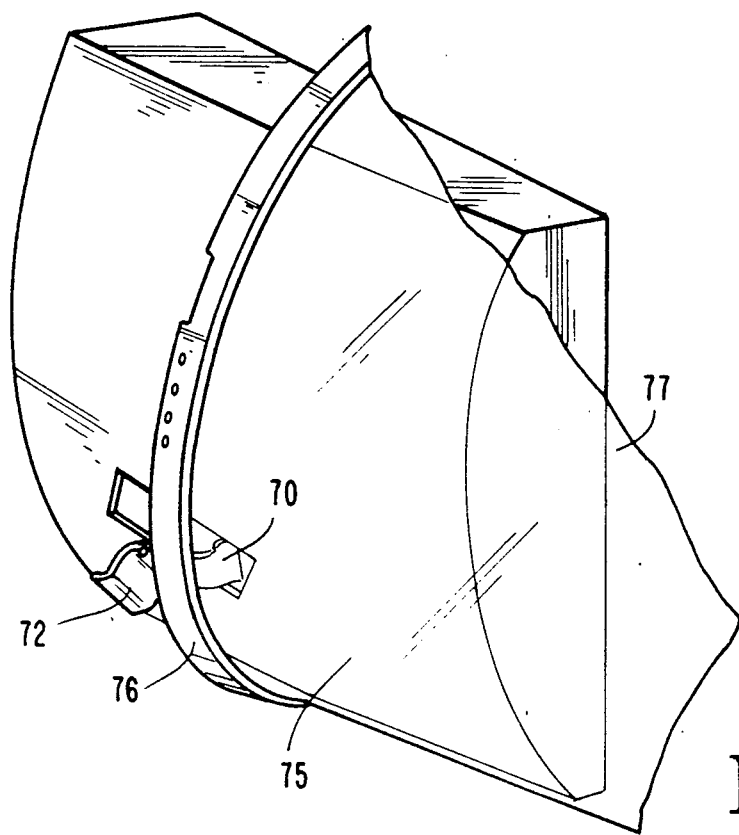
FIG. 9 is a partial elevational view of a reset switch according to the present invention showing the cover being replaced.

A second embodiment of the present invention concerns a cover actuated test mode switch. This embodiment is illustrated in FIGS. 8 and 9. FIG. 8 is a partial elevational view of such a test switch 70. The meter housing is shown with its cover removed. Switch 70 is shown on a side 71 of a meter module assembly. In the view of FIG. 8 the test switch is in the disabled mode. The switch has a scroll-like shape with outwardly projecting tab 72 for manual engagement to forwardly move the switch into the test enabled mode. A pair of pins 73a and 73b (shown in phantom) are lodged within the meter housing to provide pivotal action thereabout. A deformable dome contact 74 (shown in phantom) lies beneath switch 70. Contact 74 is pressed by edge 79, enabling the test mode, when switch 70 is pivoted forward about pins 73a and 73b.

FIG. 9 shows switch 70 in the test mode. Cover 75 is shown being replaced after removal for meter function testing. Leading edge 76 of cover 75 engages tab 72 of switch 70 forcing switch 70 to pivot clockwise about pins 73a and 73b and into the testing disabled mode. Leading edge 76 will generally be the locking ring which locks the meter cover together with the meter housing. The resetting action of meter cover 75 is facilitated by the diameter of its sidewall 77. This sidewall is formed of a diameter sufficiently small to engage tab 72 of switch 70. Of course the diameter of the cover sidewall 77 must be sufficiently large that switch 70 is not engaged while the cover is being remove. To further prevent engagement during cover removal, switch 70 may be made to snap into place once it passes a certain point in its clockwise movement.

When an operator services a meter, he places it in test mode to test the metering functions. Often, the operator will neglect to disable the test switch and the meter remains in the test mode until the next service period. While in test mode, a meter typically does not record cumulative energy consumption. Thus, if left in the test mode the meter will not perform the function for which it was designed. The configuration of cover 75 and test switch 70 prevents switch 70 from accidentally being left in the test mode after meter servicing has been performed. Replacement of cover 75 will always result in disabling of test switch 70, alleviating a common problem with meter servicing.

Figure 10:
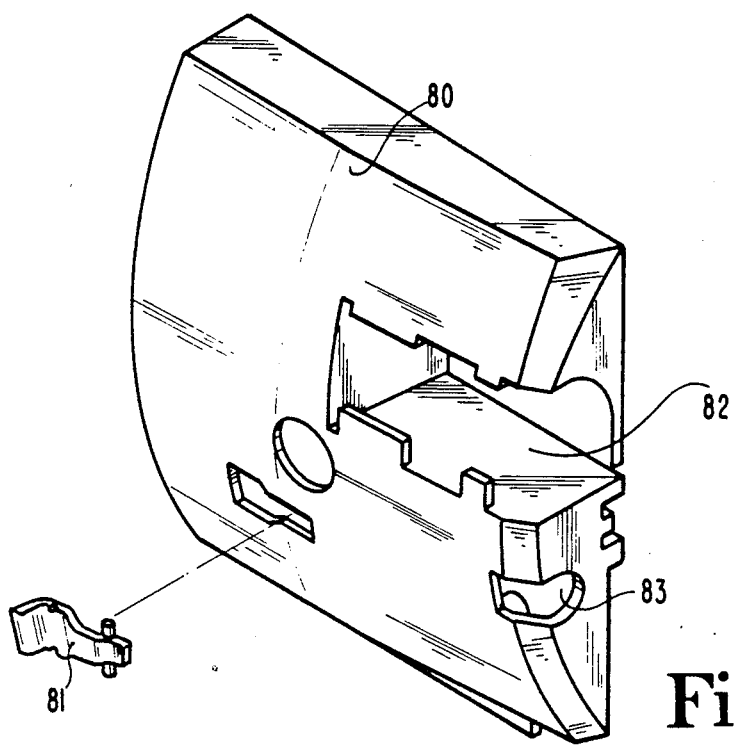
FIG. 10 is a perspective elevational view of a module assembly made according to a further embodiment of the present invention.

A third embodiment of the present invention is illustrated in FIGS. 10 through 14. It is often desirable to replace the reset and scroll switch actuator 29 shown in FIG. 1 with a actuator to which access is limited. The present invention is accordingly an ideal manner of achieving this end, among others. FIG. 10 is a perspective elevational view of the external side of a module assembly made according to the present invention and adapted to be installed on a meter such as that shown in FIG. 1. Cover disabled test switch 81 is shown in combination with module 80. The combination thereof is optional. The structure and operation of test switch 81 is as described in connection with FIGS. 8 and 9 above and will not be discussed further here. Module 80 is further provided with battery compartment 82 and scroll/reset access port 83. A battery may be mounted in compartment 82 by a conventional battery clip, although other mounting methods are contemplated. One purpose of module 80 is to provide convenient access to the meter battery which must be available for testing and service on a periodic basis.

Figure 11:
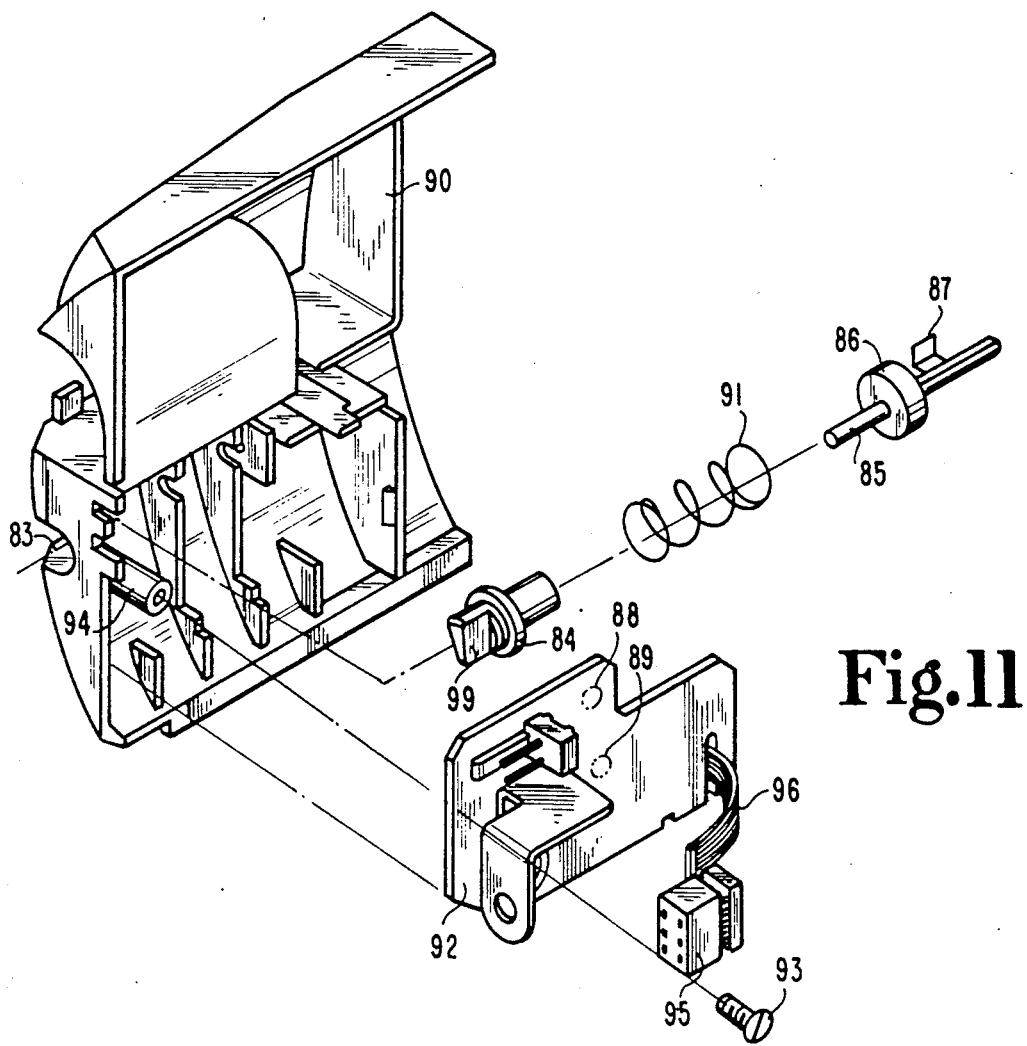
FIG. 11 is an exploded perspective view of the module assembly of FIG. 10.

FIG. 11 is an exploded perspective view of the inside of module 80. Module housing 80 is provided with opening 83 for receiving the male end 99 of wedge-shaped plunger 84. Opposite male end 99, wedge-shaped plunger 84 is keyed for the D-shaped cross-section of post 85 on actuator 86. Actuator post 86 is further provided with paddle 87 for contacting dome switches 88 and 89 (seen in phantom). A torsional spring 91 is present between post 85 and plunger 84 for biasing paddle 87 away from either dome switch. Module housing 90 is adapted to mate with board 92. Board 92 is affixed to housing 90 by means of screw 93 which is threadingly received into column 94. For connecting switches 88 and 89 with a printed circuit board of the meter (not shown), connector 95 is provided. Ribbon cable 96 connects connector 95 with the dome switches.

Figure 12:
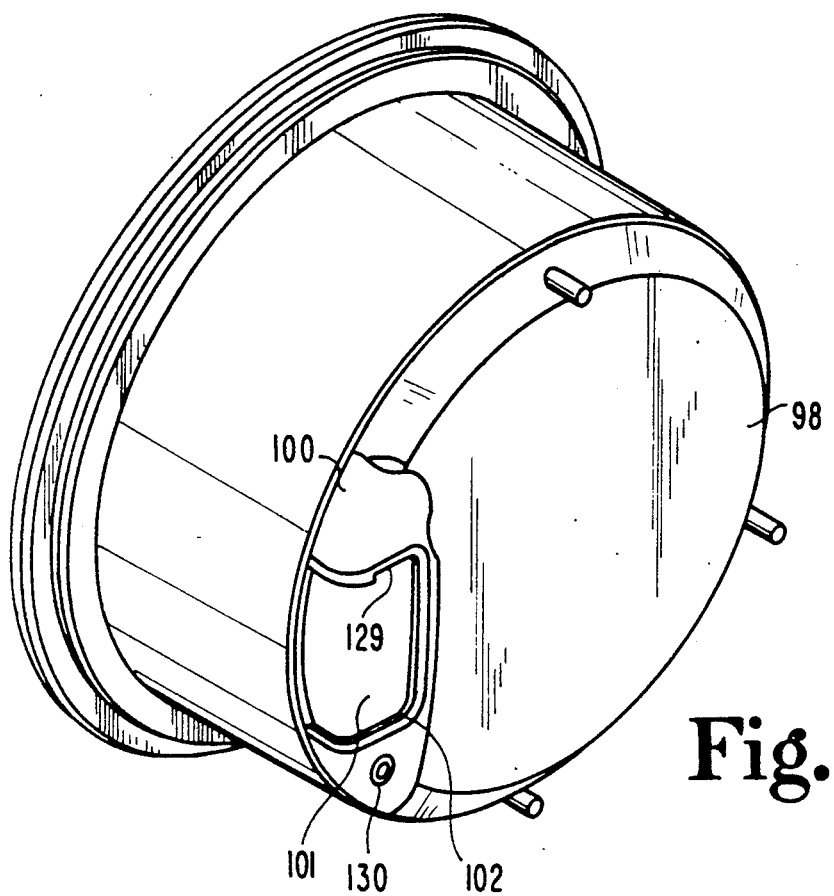
FIG. 12 is a front perspective view of a meter cover made according to the present invention with a hatch for access to the battery module of FIG. 10.

FIG. 12 illustrates a meter cover 98 which has been modified to facilitate access to module 80. This modification includes hatch 100 having opening 101 for access to module 80 which has been incorporated into the meter. Hatch 100 includes an adhesive-backed gasket 102 for sealing hatch cover (FIG. 13) against hatch 100. Gasket 102 provides a seal preventing environmental elements from interfering with the integrity of the meter components.

Figure 13:
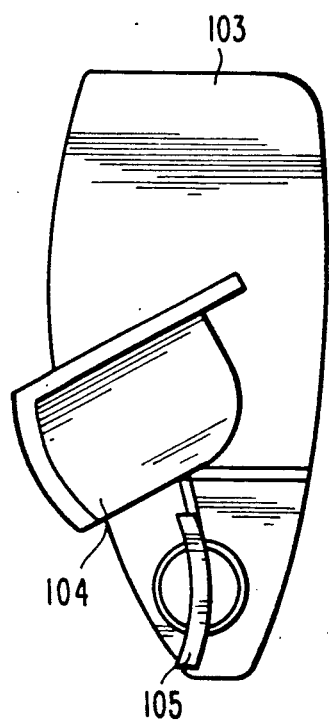
FIG. 13 is a front elevational view of a latch assembly made according to the present invention with the component parts in the scroll mode.

FIG. 13 is a front elevational view of hatch cover 103 with the locking parts unlocked and in the scroll mode. Knob 104 is shown rotated clockwise approximately one eighth turn. Latch 105 has been rotated counterclockwise one quarter turn to unlock the battery hatch for removal of hatch cover 103, if so desired. After the knob and latch are rotated, hatch cover 103 can be easily removed by pulling latch 105 in a direction away from the meter. Hatch cover 103 may then be taken off to expose battery compartment 82 and the battery therein. Hatch cover 103 is replaced by following the above steps in reverse order. This feature is described more fully below.

Figure 14:
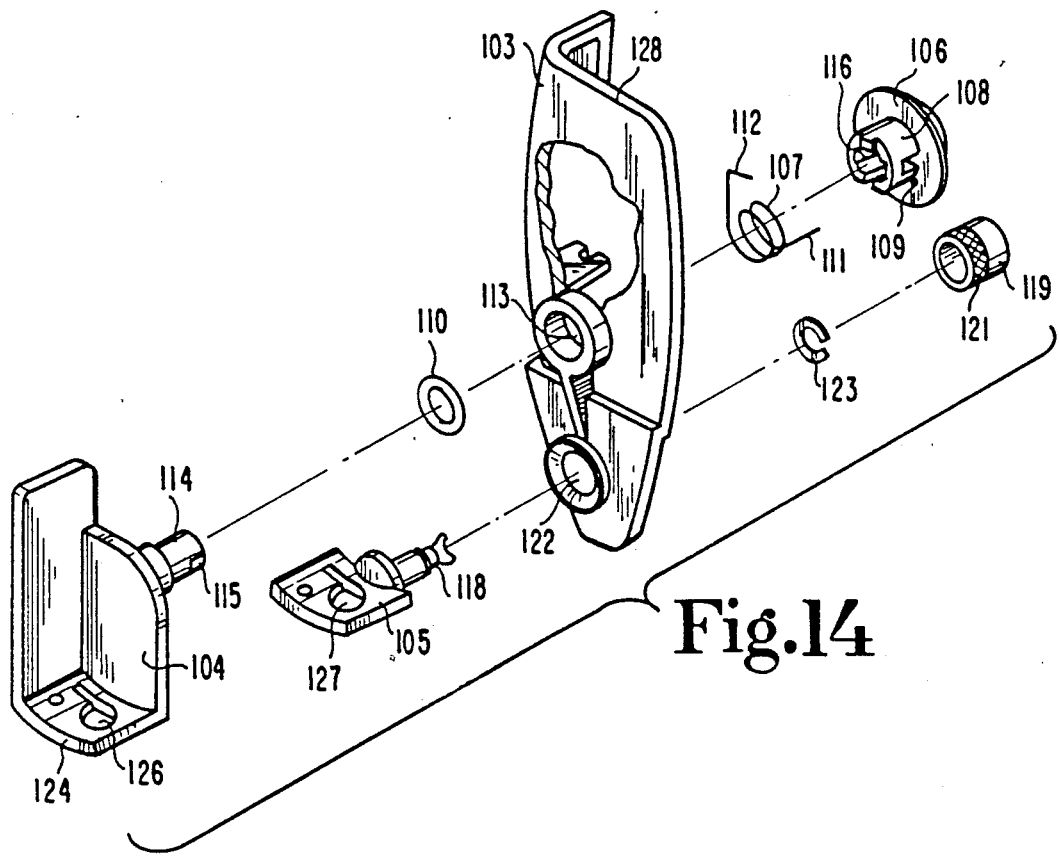
FIG. 14 is an exploded view of the hatch cover assembly of FIG. 13.

FIG. 14 is an exploded perspective view of the hatch cover assembly showing the component parts thereof. Hatch cover 103 is provided with means to externally actuate paddle 87. Coupling 106 is adapted to receive wedge-shaped male end 99 of plunger 84 (FIG. 11). Torsion spring 107 is received about projection 108 on coupling 106. Moreover, coupling 106 is provided with bore 109 for receiving straight end 111 of torsion spring 107. Torsion spring 107 has a 90° bend 112 received in a slot (not shown) of hatch cover 103. Hatch cover 103 is provided with hole 113 into which O-ring 110 is inserted for sealingly receiving male connector 114 of knob 104. O-ring 110 is preferably made of neoprene. Male connector 114 is provided with tongues 115 for engagement in grooves 116 of female projection 108 on coupling 106. When assembled, the combination of actuator 86 (FIG. 11), plunger 84 (FIG. 11), coupling 106 and knob 104 form an actuator assembly allowing manual rotation of knob 104 to be imparted to paddle 87 (FIG. 11). The torsion spring 107 can be eliminated if the recentering feature performed by the spring is not desired.

Hatch cover 103 is further provided with a locking mechanism. Latch 105 includes quarter turn male fastener 118. Quarter turn male fastener 118 is of the half-moon type and is received within the corresponding quarter turn female fastener 119. A split ring retainer 123 assists in retention of latch 105. Quarter turn female fastener 119 has a knurled external surface 121 for tight engagement within hole 130 in meter cover 98 (FIG. 12). Moreover, fastener 119 is preferably ultrasonically welded within hole 130.

Figure 15:
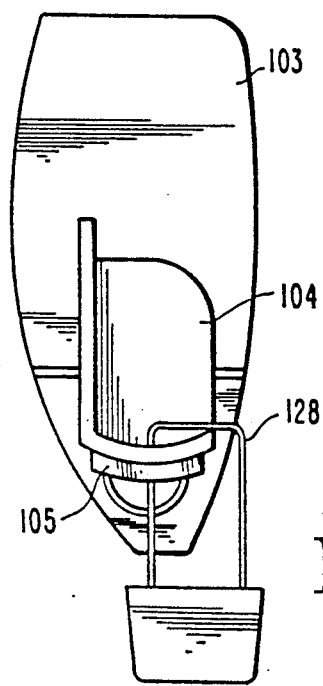
FIG. 15 is a front elevational view of the latch assembly of FIG. 13 with the component parts latched.

FIG. 15 is a front elevational view of cover 103 with knob 104 and latch 105 in the locked (latched) position. Latch 105 is concave, while knob 104 has a corresponding mating concavity 124. In the locked position of FIG. 15, the concavity 124 nests with latch 105. Moreover, concavity 124 and latch 105 are provided with key-shaped holes 126 and 127, respectively for receiving security tie 128 therethrough. Security tie 128 locks latch 105 and knob 104 in the position of FIG. 15 to prevent unauthorized access to the meter. In addition, security ties are commonly provided with tamper indicators.

In operation, when paddle 87 contacts reset switch 88 the consumption counter is reset. This is achieved by imparting a rotation to plunger 84 by rotation of knob 104. The scroll mode is enabled when paddle 87 is rotated in the opposite direction by corresponding rotation of plunger 84, imparting rotation to knob 104. In the scroll mode, data may be transmitted between the emitter/detector and an external reader/programmer through an optical coupler as described above. When maintaining force is removed from plunger 84, torsion spring 91 urges paddle 87 away from the switches, thereby disabling them. Torsion spring biases paddle 87 to a position approximately half way between the dome switches. This function of torsion spring 87 prevents accidental actuation of either switch.

Because of the mating arrangement of knob 104 with coupling 106 and of coupling 106 with plunger 84, the knob and hatch cover 103 may be easily removed from hatch 100. Further, the corresponding tongues 115, grooves 116 and wedge-shapes ensure that the paddle actuator assembly is correctly reassembled when hatch cover 103 is repositioned. Hatch cover 103 is installed into hatch opening 101 by first securely rolling top edge 128 of the hatch cover under rim 129 (FIG. 12) of hatch 100. For installation, knob 104 must be rotated one eighth turn clockwise while latch 105 must be rotated one quarter turn as shown in FIG. 13. In this position, the quarter turn fastener elements 118 and 119 (FIG. 14) are in the open (unfastened) mode. To lock the hatch, latch 105 is rotated clockwise by one quarter turn, causing the fastener elements to close (fasten). Then knob 104 is rotated counterclockwise for approximately one eighth turn to achieve the position of FIG. 15. The quarter turn fastener parts 105 and 119 are available from Southco.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A cover for an energy consumption meter, the meter having a reset mode of operation and a meter body having a battery mounted therein and carrying reset mode hardware for actuating the meter reset mode, the cover comprising:
    a cover member mountable over the meter body;
    a modular battery access hatch assembly including;
    a hatch opening defined in said cover member for access to the battery therethrough when said cover member is mounted over the meter body;
    a hatch cover mountable over said opening to close said hatch opening;
    a resetting switch carried by said hatch cover and movable externally of said cover member to a reset position in which said resetting switch actuates the reset mode hardware;
    a biasing means for normally biasing said actuating means away from said reset position; and
    a latching means for latching said hatch cover onto said cover member.

2. The cover of claim 1 wherein said meter has means for providing a scroll mode and said hatch cover further includes a scrolling switch for actuating said mode.

3. The cover of claim 2 wherein said scrolling switch and resetting switch are present as a single switch.

4. The cover of claim 3 wherein the scroll mode is actuated by the rotation of said switch in one direction and the reset mode is actuated by rotation of said switch in the opposite direction.

5. The cover of claim 4 wherein said biasing means biases said switch in a position intermediate the actuation of the reset mode and the actuation of the scroll mode.

6. The cover of claim 1 wherein said resetting switch includes a paddle and a pressure operable switch, wherein reset switch operates to rotate said paddle to depress said pressure operable switch.

7. The cover of claim 1 wherein said reset switch includes a knob, a coupling mated with said knob and having a wedge-shaped female portion, a wedge-shaped male plunger received by said female portion and keyed to mate with a corresponding switch actuator.

8. The cover of claim 2 wherein said knob and said coupling are keyed for facilitating removal of said hatch cover and replacement of said knob and said coupling after the replacement of said cover.

9. The cover of claim 1 wherein said reset switch is positionable to prevent unlatching of said cover.

10. The cover of claim 9 wherein said latching means and said reset switch are provided with means for receiving a security tie, said security tie locking said latching means and said reset switch together.

11. The cover of claim 10 wherein said latching means includes a quarter turn fastener.

* * * * *